United States Patent

Yang et al.

Patent Number: 5,808,572
Date of Patent: Sep. 15, 1998

[54] METHOD AND APPARATUS FOR FINITE-LENGTH ARITHMETIC CODING

[75] Inventors: Jar-Ferr Yang; Din-Yuen Chan; Sheng-Yih Chen, all of Tainan, Taiwan

[73] Assignee: National Science Council, Taipei, Taiwan

[21] Appl. No.: 862,126

[22] Filed: May 22, 1997

[51] Int. Cl.[6] .................................................. H03M 7/30
[52] U.S. Cl. ............................................. 341/107; 341/51
[58] Field of Search ..................................... 341/106, 107, 341/50, 65, 67, 51

[56] References Cited

U.S. PATENT DOCUMENTS

| | | | |
|---|---|---|---|
| 4,168,513 | 9/1979 | Hains et al. | 358/261 |
| 4,989,000 | 1/1991 | Chevion et al. | 341/107 |
| 5,357,250 | 10/1994 | Healey et al. | 341/107 |
| 5,471,207 | 11/1995 | Zandi et al. | 341/107 |
| 5,546,080 | 8/1996 | Langdon, Jr. et al. | 341/107 |
| 5,587,710 | 12/1996 | Choo et al. | 341/107 |
| 5,650,783 | 7/1997 | Murashita et al. | 341/107 |
| 5,654,702 | 8/1997 | Ran | 341/51 |
| 5,710,562 | 1/1998 | Gormish et al. | 341/107 |

*Primary Examiner*—Marc S. Hoff
*Assistant Examiner*—Peguy JeanPierre
*Attorney, Agent, or Firm*—Hitt Chwang & Gaines, P.C.

[57] ABSTRACT

In this invention, we introduce a connection indexing algorithm for realizing the arithmetic coding in finite wordlength processors. By determining the number of encoded information bits according to a difference between the finite wordlength and a residual termination parameter defined by the maximum difference of the information bits of any two adjacent symbols in the ordered-probabilities symbols set, the information of the last symbol is split into the current and the subsequent finite length codewords. The two or three encoded symbols split into the current and the subsequent finite length codewords are decoded independently, and the indices thereof are added to form a decoded symbol having an index equal to a sum of the addition.

4 Claims, 9 Drawing Sheets

METHOD AND APPARATUS FOR FINITE-LENGTH ARITHMETIC CODING

BACKGROUND

I. Introduction

Lossless compression algorithms [1], which can compact the message symbols into the minimum information bits, are the popular techniques for achieving effective communications without distorting the source signals. For compacting memoryless symbols, Shannon has proven that the minimum average length of the encoded bits should be limited by the entropy [2, 3]. For achieving the entropy coding, the arithmetic coding technique is one of the best choices. The implementation for the general arithmetic coding had also been addressed for many years ago [4, 5]. The arithmetic coder needs multiplication (division) and addition (subtraction) operations for encoding (decoding) the codewords. If the complete sequence of symbols is encoded in a single unlimited long codeword, the arithmetic coding [1,6] can theoretically compact the data into the entropy. However, the encoding and decoding processors for long arithmetic codes require an associated long word length processors which are impractical for real applications. Once a single error bit occurs, the entire subsequent symbols will be completely smashed as decoding this long codeword. Hence, some practical encoding algorithms to limit the encoded codeword to reasonable finite length are developed by sacrificing the compression efficient.

Originally, the realizations of the arithmetic coding for binary symbols are more maturely developed and more practically used than for larger than two symbols [6–11]. Recently, several arithmetic coding techniques [10–16], which are developed under the consideration of a limited precision machine, become feasible for encoding general multisymbol source codes. In this invention, we introduce a practical, effective and regular arithmetic coding implementation which is appropriated to encode the events in over-two-symbol alphabets into fixed precision codewords.

The proposed implementation in [12] uses table lookup to achieve a fast alternative to arithmetic operations. Further, the proposed parallel process can speed up the implementation. The block arithmetic coding proposed in [15] used a novel recursive decomposition algorithm to split the most probable input sequence into many successors such that the encoder can be optimally dynamic programmed and decoding errors can be confined to the block in question. With processors possessing low fixed resolutions, the arithmetic coding implementation proposed in [16] can use the probability tables with high precision probabilities to regularly encode and decode the inputted objects. But, this method will suffer catastrophic failure in the presence of few error bits. For an example in other kinds of improvement methods, the compression effect of arithmetic coding can be elevated by decorrelating a original source sequence as a residue sequence by one linear predictor [17].

However, in most arithmetic coding techniques, the end-of-block symbol (EOB) is customarily used for resulting in decodeable codewords [5,15,16,18]. Therefore, EOBs need to be subtly designed in arithmetic coding to obtain the least influence in compression performance. The shorter length in the code table for encoding the EOB could be considered. However, the shorter codeword implies the frequently-happened symbol. In this case the EOB symbol will squeeze the probability table of actual symbols a lot. One may choose a longer codeword for the EOB symbol but resulting in a less efficient coding for small size limited codeword length. No matter how skillful selection for the EOB symbol, the degeneration of compression efficiency will be significant. In the other way, we may replace the EOB by the side information which provides the number of the most encoded events. For this case, it also need many prefix bits to be appended in the codeword.

Without the EOB, side information and complex criteria, we can efficiently encode the inputted events to several codewords with the limitation in ordinarily used wordlength. The proposed coding algorithm focuses when and how one inputted event is extended to two or three frequently-happened symbols, which are used to refer its symbol index to efficiently fill the encoded codeword. Hence, the total encoded bits can be very close to the total accumulated information. Further, as a channel error occurs, the failure can be constrained to the blocks where the corrupted bits are existed. In our simulations, the proposed implementation can achieve good performance that average compression bits are near the total accumulated information, which is theoretically limited by Shannon's coding theorem.

II. Overview of Arithmetic Coding

After statistical analysis of occurrence probability, we can arrange N source symbols $\{S_0, S_1, S_2, \ldots, S_{N-1}\}$ in descending probabilities order which satisfy $$p(S_0) \geq p(S_1) \geq \ldots \geq p(S_{n-1}) \tag{1}$$

The index, n, of course, not only represents the symbol, $S_n$, but also implies that the encoded information bits of $\{S_0, S_1, S_2, \ldots, S_{N-1}\}$ are $$I(S_0) \geq I(S_l) \geq \ldots \geq I(S_{N-1}), \tag{2}$$

where $I(S_n) = -\log(p(S_n))$. For simplicity, we use the symbol index to represent the symbol itself hereafter. Hence, we have $p(n)=p(S_n)$ and $I(n)=I(S_n)$ for $n=0,1,\ldots,(N-1)$. The cumulative probability before the $n^{th}$ symbol is defined as $$P_c(n) = \sum_{j=0}^{n-1} p(j), \text{ for } 1 \leq n \leq N-1 \tag{3}$$

where $P_c(0)=0$ and $P_c(N)=1$ for two extreme cases.

A sequence of events $\{a_0, a_1, a_2, \ldots, a_m, \ldots\}$, which are randomly drawn from the above symbols, $\{S_0, S_1, \ldots, S_{N-1}\}$ under the probability model defined in (1), need to be losslessly compressed. If the $m^{th}$ event, $a_m$, happens to be $S_n$, we simplify the notation $a_m = S_n$ by referring the index of the occurrence symbol, i.e., $O(a_m)=n$.

In the arithmetic code encoder, the cumulative probabilities, $P_c(n)$ for $n=1, 2, \ldots, (N-1)$ of all ordered symbols are stored as a probability table. Initially, we choose the lowbound and upbound parameters, $B_L$ and $B_U$ to be $P_c(0)$ and $P_c(N)$, respectively. When the $m^{th}$ event, $a_m$ is encoded, we can use its symbol index $O(a_m)$ to obtain two corresponding cumulative probabilities $P_c(O(a_m)+1)$ and $P_c(O(a_m))$ to recursively update the lowbound and the upbound respectively as, $$B_L = B_L + B_L(B_U - B_L) \times P_c(O(a_m)) \tag{4}$$

and $$B_U = B_L + (B_U - B_L) \times P_c(O(a_m)+1). \tag{5}$$

FIG. 1 shows the recursively updating operations for encoding the arithmetic codes. By relating to the number of events, the inputted sequence of events are finally encoded by a suitable value W, which is within the $B_L$ and $B_U$.

$$B_L < W < B_U \tag{6}$$

In arithmetic code decoder, the arithmetic codeword W, is treated as a processed data. By comparing W to the cumulative probabilities, we can easily identify the probability interval, which W is bounded in two adjacent cumulative probabilities, i.e., $$P_c(n) \leq W < P_c(n+1). \tag{7}$$

The first decoded event noted $a_0$ is $S_n$. In order to retrieve the second event, we can subtract the lower cumulative probability of $S_n$ from W followed by the normalization of the difference between $P_c(n)$ and $P_c(n+1)$ as $$W = \frac{W - P_c(n)}{P_c(n+1) - P_c(n)}. \tag{8}$$

Again, by using (7), we can search the location interval of two adjacent cumulative probablilities for the newly updated W provided by (8), we can correctly recover the second event, etc. FIG. 2 shows the detailed diagram of the basic recursive arithmetic code decoder.

From FIGS. 1 and 2, both the encoder 10 and the decoder 20 must handle the mathematical operations in a long bit length which should be greater than the codeword length. In practical finite wordlength machines, it is obviously unfeasible for processing W of very long wordlength in processors. Besides, the error propagation of arithmetic codes will destroy the sequence of encoded symbols behind a single error in the transmission. Therefore, we proposed an efficient algorithm for encoding and decoding finite-length arithmetic codes to assure decodeability and keep high compression ratio. And the error propagation of the proposed coding techniques is limited in one block only.

SUMMARY OF THE INVENTION

A method for transmitting an input signal having a plurality of symbols in accordance with the present invention comprises the following steps:

a) encoding said input signal received from a source to obtain a finite length codeword of said input signal by finite-length arithmetic coding; and b) outputting said finite length codeword;
wherein said encoding comprising the following steps:

a1) selecting a predetermined finite wodlength L;

a2) supplying a probability estimate of said input signal;

a3) obtaining information bits for each symbol of said input signal according to said probability estimate;

a4) indexing said symbols according to their information bits in descending probabilities from 0, 1, 2 . . . to N–1;

a5) calculating the maximum difference of the information bits of any two adjacent symbols in the order of their indices as a residual termination parameter D;

a6) setting an accumulated information equal to zero;

a7) fetching in sequence one event $O(a_k)$ from said input signal;

a8) updating said accumulated information by adding information bits of said fetched event to said accumulated information;

a9) arithmetically encoding said fetched event in response to said probability estimate if the updated accumulated information is less than L–D;

a10) repeating steps a7) to a9) until the updated accumulated information is equal to or greater than L–D;

a11) recording an index n of a symbol of an event which is the last event being fetched in step a10);

a12) finding a symbol $S_{n1}$ having an index of n1 from said plurality of symbols of said input signal so that a condition of a sum of said accumulated information and information bits of said symbol $S_{n1}$ greater than L–D and less than or equal to L is satisfied, and said n1 is the maximum among the indices of the symbols which satisfy said condition;

a13) arithmetically encoding said symbol $S_{n1}$ in response to said probability estimate so that a finite length codeword containing the arithmetically encoded events obtained in steps a9) and a10) and the arithmetically encoded symbol of said symbol $S_{n1}$ is formed;

a14) finding a symbol from said plurality symbols of said input signal having an index of n2 so that n1+n2=n;

a15) arithmetically encoding said symbol $S_{n2}$ in response to said probability estimate as a first encoded symbol of a codeword next said finite length codeword;

a16) setting an accumulated information equal to the information bit of the symbol $S_{n2}$; and a17) repeating steps a7) to a16) until all of the events of said input signal are arithmetically encoded;
wherein D is equal to or greater than the information bits of the symbol of said input signal having the largest probability.

The present invention also discloses a method for decoding finite length codewords generated according to the method of the present invention, which comprises the following steps:

a) inputting said finite length codewords, each of which has a predetermined finite wordlength L and contains a plurality of arithmetically encoded symbols; and b) arithmetically decoding said arithmetically encoded symbols to generate a plurality of decoded symbols; and recovering a sequence of events from said decoded symbols wherein said step b) comprising the following steps:

b1) fetching a first finite length codeword from said inputted finite length codewords;

b2) setting an accumulated information equal to zero;

b3) arithmetically decoding in sequence an arithmetically encoded symbol from said first finite length codeword in response to said probability estimate to generate a decoded symbol;

b4) updating said accumulated information by adding information bits of said decoded symbol to said accumulated information;

b5) outputting said decoded symbol as a recovered event if the updated accumulated information is less than L–D;

b6) repeating steps b3) to b5) until the updated accumulated information is equal to or greater than L–D;

b7) recording an index n1 of the decoded symbol which is the last symbol being arithmetically decoded in step b6);

b8) fetching in sequence a $m^{th}$ finite length codeword from said inputted finite length codewords, wherein said m is an integer of not less than 2;

b9) setting an accumulated information equal to zero;

b10) arithmetically decoding in sequence an arithmetically encoded symbol of said $m^{th}$ finite length codeword in response to said probability estimate to generate a decoded symbol;

b11) updating said accumulated information by adding information bits of said decoded symbol to said accumulated information;

b12) if the updated accumulated information is equal to the information bits of said decoded symbol, recording an index n2 of the decoded symbol and outputting a decoded symbol having an index n which is equal to a sum of n1 and n2 as a recovered event;

b13) repeating steps b10) to b11) and outputting said decoded symbol as a recovered event until the updated accumulated information is equal to or greater than L–D;

b14) recording an index n1 of the decoded symbol which is the last symbol being arithmetically decoded in step b13);

b15) repeating steps b8) to b14) until all of said inputted finite length codewords are fetched and arithmetically decoded.

BRIEF DESCRIPTION OF THE DRAWINGS

FIG. 9($b$) is a schematic block diagram illustrating an apparatus for decoding codewords of the present invention.

DETAILED DESCRIPTION OF THE INVENTION

Figure 1:
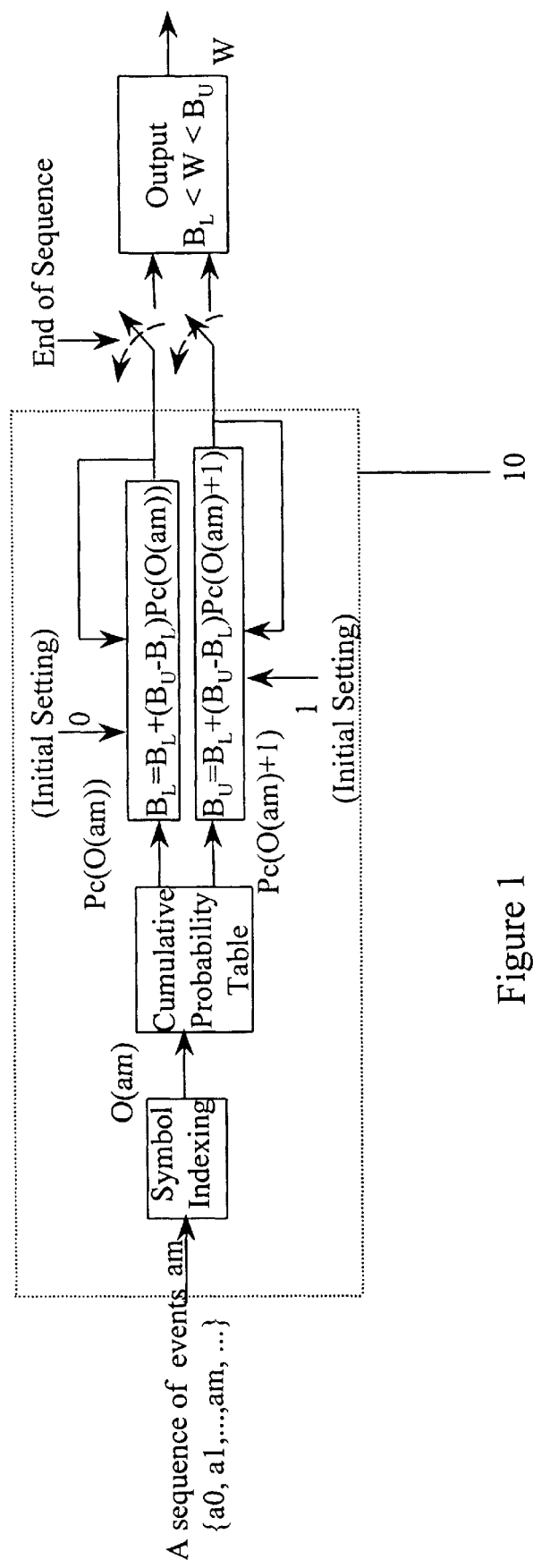
FIG. 1 is a schematic block diagram which shows the recursively updating operations for encoding the arithmetic codes.

III. Efficient Arithmetic Coding Technique Using Connection Indexing Concept

The arithmetic code based on the inputted symbols performs the recursive partition of active probability duration. The more number of events are encoded, the more effect of compression achieved. However, specially for the decoder, the precision of the partitioning upper and lower bounds become proportionally large when the length of codeword is increased. In order to avoid the impractical infinite precision, the proper limit of the codeword length for the arithmetic coding should be considered. At the same time, the error prorogation effect of the arithmetic code can be also limited in a single small block if a finite-length codeword is utilized. Unfortunately, for a finite-length arithmetic codeword, frequent transmission of the side information bits, which depicts the number of events or the end-of-block symbol, and the unutilized residual information bits, which are no longer enough for the next symbol, will dramatically reduce its compression efficiency. In this section, we will propose an efficient connection indexing algorithm for finite-length arithmetic codes.

III-1. Codeword Length Prediction

If the arithmetic codes are encoded by the processes depicted in Section II, the codeword length encoded up to the $m^{th}$ event, $a_m$ can be predicted by the accumulated information expressed as $$I_A(m) = \sum_{i=0}^{m} I(O(a_i)) \tag{9}$$
$$= I_A(m-1) + I((O(a_m))$$

for $m \geq 0$, where $I_A(-1)=0$. The proof of the above prediction is straightforward. For the first event, m=0, the upbound and lowbound are $B_L=P_c(O(a_0))$ and $B_U=P_c(O(a_0)+1)$, respectively. The resolution to distinguish $B_L$ and $B_U$ for the first event requires $$R(0)=B_U-B_L=P_c(O(a_0)+1)-P_c(O(a_0))=p(O)a_0)) \tag{10}$$

It is obvious that we also can prove that the the resolution of $B_L$ and $B_U$ for the $m^{th}$ event becomes $$R(m) = B_U - B_L = \prod_{i=0}^{m} p(O(a_i)). \tag{11}$$

The minimum number of bits (or number of decimal digits), which need to represent the resultion of R(m) becomes $$I_A(m)=-\log(R(m)), \tag{12}$$

if the base of logarithm is 2 (or 10). From (11) and (12), we may say that (9) can be correctly used to recursively predict the word length of the encoded codeword if the accumulated information is reset to zero initially. From (11) and (12), we also learn a important concept that each symbol exactly increases the word length, which are exactly equal to its self-information defined in (2) for arithmetic codes. This also indirectly proves that the arithmetic code achieves the bound stated by Shannon's coding theorem.

III-2. Finite-Length Arithmetic Coding

Assuming that the processors in both encoder and decoder can perform the codeword length up to L bits, i.e., the maximum length of codeword is L. Thus, the sequence of events are packed into several fixed length L-bit codewords, i.e., blocks for transmission. Hence, we assume that the block synchronization is done by the system. L-bit block. In other words, we know exactly where each block starts from.

First Thought Method—Undecodable Coding

Without the need of the EOB symbol, the proposed finite-length arithmetic coding uses accumulated information depicted in (9) as an important indication function. With initial conditions, K=0, and $I_A(0)=0$, the finite-length arithmetic code is encoded from the nominal coding procedure described in FIG. 1. The inputted sequence of events are $\{a_0, a_1, a_2, \ldots a_m, \ldots ,\}$. The encoding process will automatically stop at the $K^{th}$ events, when the accumulated information is greater than L, i.e., $I_A(K)>L$. The search for the termination $K^{th}$ event can be expressed by $$K = \underset{m}{\text{MIN}} \ \{I_A(m) > L, \text{ for } m > 0\}, \tag{13}$$

where $I_A(m)$ depicted in (9) denotes the number of the current used bits. Once the encoding stops, the remaining $(L-I_A(K-1))$ information bits, which is not enough to convey information $a_K$, will be wasted. By setting $I_A(K)=0$ and a new arithmetically encoding process for the new block, we may start a new encoding processing from the $K^{th}$ event, $a_K$. Of course, the above straightforward encoding process is wasteful in the transmission. It is also noted that the above encoded codeword is not unique decodeable obviously. Although the $K^{th}$ event can not be fitted into one L-bit block, i.e., $I_A(K)=I_A(K-1)+I(O(a_K))>L$, there may exist many symbols, which have shorter length codewords than that of $a_K$, to satisfy $$I_A(K-1)+I(n) \leq L \tag{14}$$

In this case, the decoder may erroneously insert a symbol $S_n$ (or symbols) between original $a_{K-1}$ and $a_K$. How to effectively use the remaining $(L-I_A(K-1))$ information bits and how to terminate the decoding process right at the original ending symbol become the most important issue in finite-length arithmetic coding.

Connection Indexing Arithmetic Codes

Before discussions of the proposed coding algorithm, we briefly introduce the basic concept of connection indexing. Since the symbol is characterized by its symbol index n, the symbol index n can be decomposed by the sum of two smaller indices, $n_1$ and $n_2$ such that $$n=n_1+n_2 \tag{15}$$

where $0 \leq n_1 \leq n$ and $0 \leq n_2 \leq n$ for achieving efficient coding. If the last symbol index is split into two smaller indices as (15) shown, the Level-1 connection indexing technique is used for finite length arithmetic coding. If the symbol index is further decomposed into three smaller indices as $$n=n_1+n_2+n_3, \tag{16}$$

the Level-2 connection indexing technique is used. Of course, we should choose $n_1$ and $n_2$ is greater than zero for achieving efficient coding. When the last symbol, $S_n$ can not be included in the finite word length arithmetic code, the symbol with $S_{n_1}$ could be fitted in the remaining bits. It is obvious that the about connection indexing techniques can save the wasteful information bits if we can identify which one is the symbol index and which one is connection index in both encoding and decoding processes.

Therefore, we define an important residual termination (RT) parameter, $$D=\text{Max}\{I(n)-I(n-1)\}n=0, 1, \ldots, N-1\{, \tag{17}$$

which is the maximum information difference of two adjacent symbols in the ordered-probability symbols set. For the finite-length arithmetic coding, we should monitor not only the fullness of each block, i.e., $I_A(K)>L$ but also the number of residual information bits used in the previous event, i.e., $I_A(K-1)>L-D$. The connection indexing concept must be constrained to $D \geq I(0)$ condition. Since $I(0)$ is generally very small, the condition can be almost satisfied in all used probability tables. With the connection indexing concept and the RT parameter, we will discussed the finite-length arithmetic coding with Level-1 and Level-2 connection indexing.

A. Level-1 Connection Indexing

With the same coding procedure as the first thought method, however, the accumulated information will be continuously observed to check if $I_A(K)$ is greater than L-D or not. When $I_A(K) \leq L-D$, the encoding process will keep on the normal encoding procedure depicted in FIG. 1. When $I_A(K)>L-D$ is first detected, the coding procedure will change to the connection indexing procedure. In the connection indexing procedure, there are two possible cases: either $I_A(K)>L$ or $I_A(k) \leq L$.

Case 1: $I_A(k)>L$

In this case, we will replace the $K^{th}$ event by two smaller-information symbols. In indexing expressions, we have $$n=O(a_K)=n_1+n_2 \tag{18}$$

In order to utilize more of the residual information in the current block, we suggest that $n_1$ should be chosen as large as possible. Thus, we can choose a symbol $S_{n_1}$ such that $$n_1 = \underset{0 \leq j \leq N-1}{\text{MAX}} \{I(j) \leq L - I_A(K-1)\} \tag{19}$$

Referring to (17) for $D \geq I(0)$, we can find at least one $n_1$ for the accumulated information to satisfy the inequality, $$L-D<I_A(K-1)+I(n_1) \leq L. \tag{20}$$

Then, the arithmetic coding procedure will encode the final symbol, $S_{n_1}$ as the successive event of $a_{K-1}$ instead of $a_K$. As to the symbol with the remaining index, $$n_2=O(a_K)-n_1, \tag{21}$$

it will be encoded in the next new block. Hence, the new block will encode the first symbol, $S_{n_2}$ followed by $a_{K+1}$, $a_{K+2}, \ldots$, etc. Thus, the coding processes for the second and it successive blocks will be completely the same as the first block except the first encoded symbol is the second connection indexing symbol of the previous block.

Case 2: $I_A(k) \leq L$

In this case, the residual information can provide enough spaces to encode the $K^{th}$ inputted event. After encoding the $K^{th}$ event, we can not guarantee that the residual information is still able to include information of anyone symbol even if the symbol is the most probable symbol $S_0$. According to necessity of indexing connection, we can select $$n_1=O(a_K) \text{ and } n_2=0 \tag{22}$$

which can be treated as the special case of (21). In the current block, we can encode the last symbol $a_K$. However, the symbol $S_0$ must be first encoded in the next arithmetic code followed by $a_{K+1}, a_{K+2}, \ldots$, etc. Of course, the symbol $S_0$ is wasted for the entire finite-length arithmetic code in this case. It is noted that the information of $S_0$, $I(0)$ is the smallest in all symbols (even if the EOB symbol is one of them). Comparing to any well-designed EOB symbol, the proposed coding method in this case still requires less information bits. In other words, the Level-1 connection indexing can make finite-length arithmetic coding efficient and regular.

Figure 2:
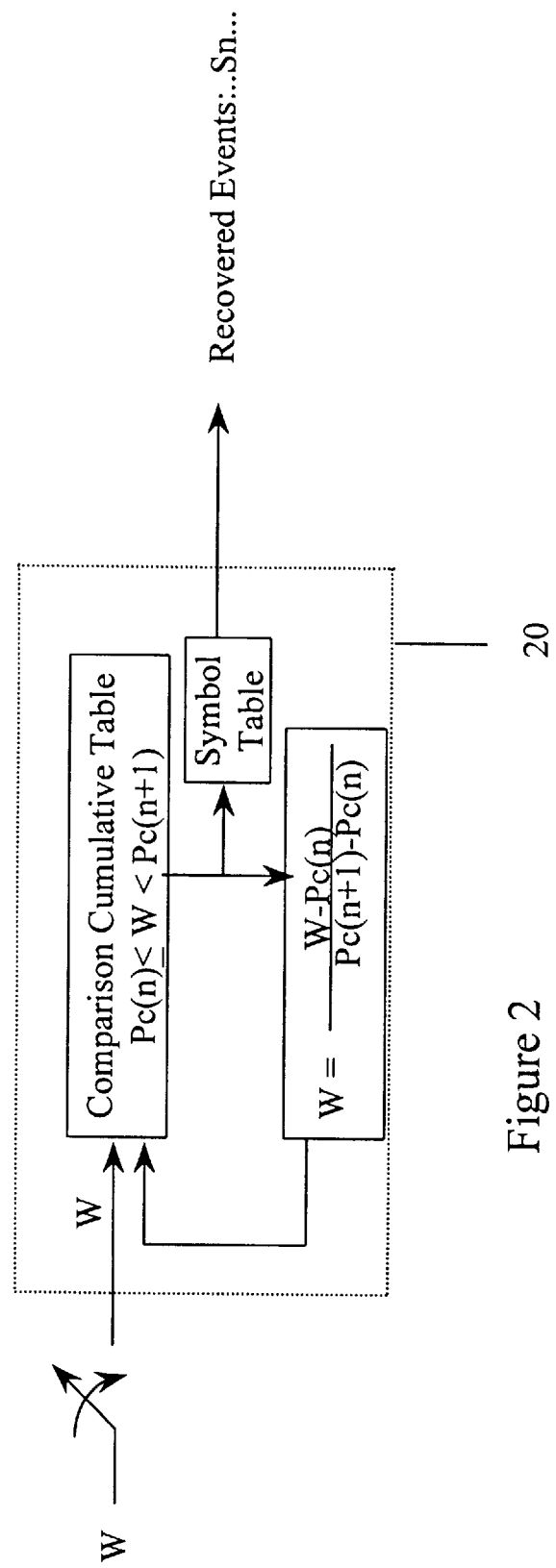
FIG. 2 is a schematic block diagram which shows the recursively updating operations for decoding the arithmetic codes.
Figure 3:
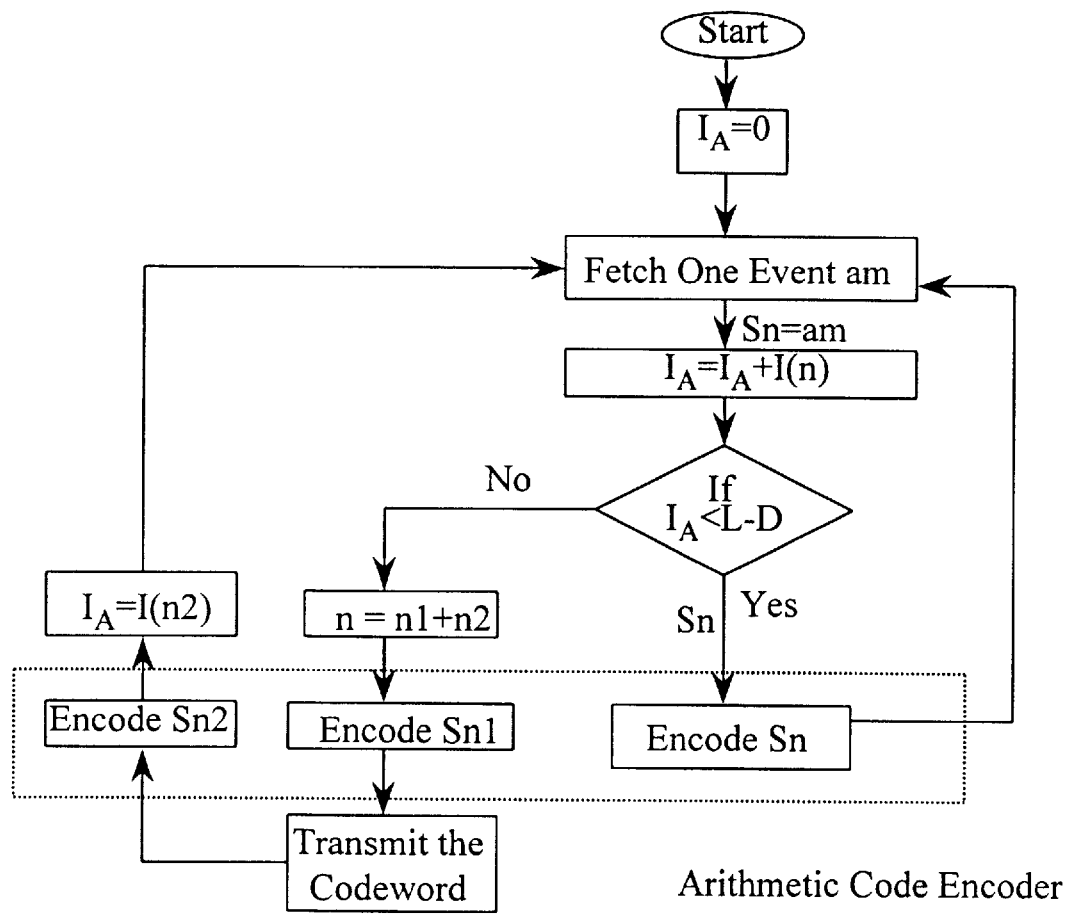
FIG. 3 is a block diagram flow chart illustrating an encoding algorithm in accordance with an enbodiment of the present invention.
Figure 4:
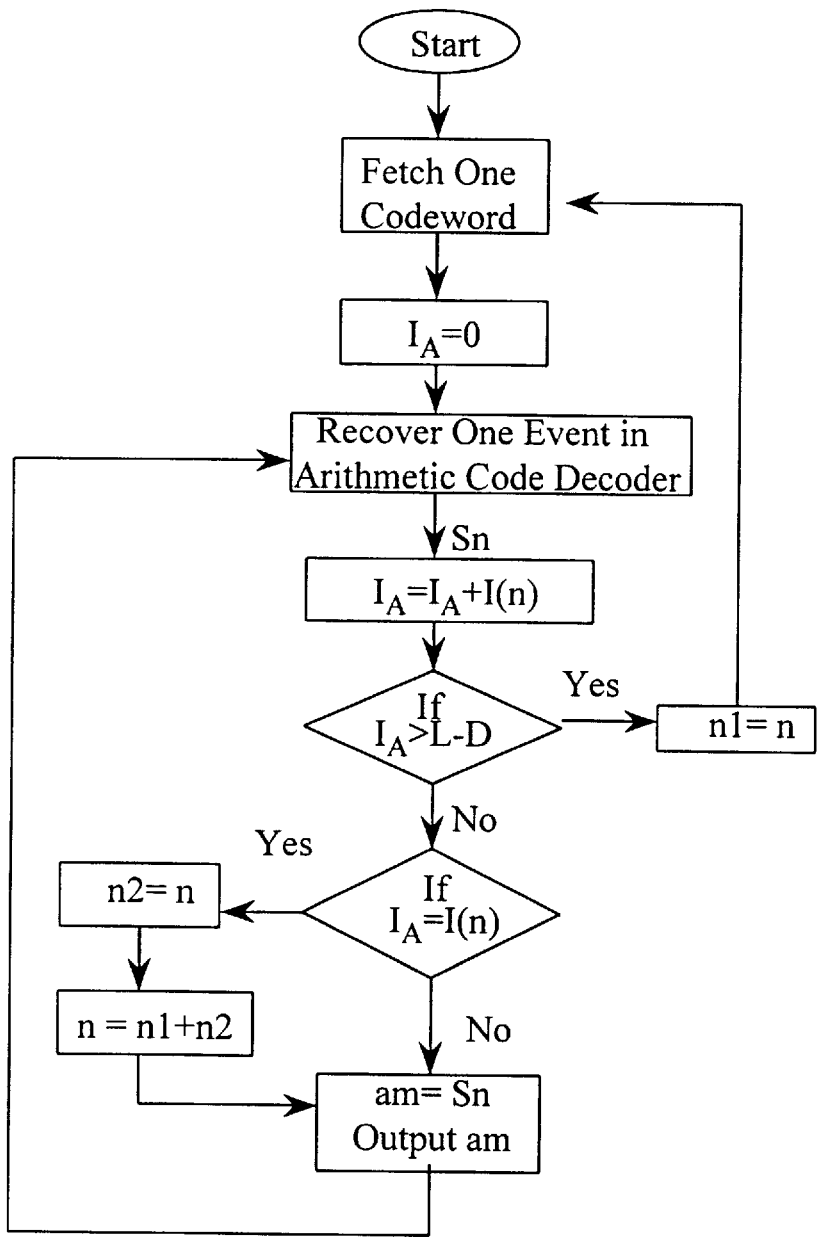
FIG. 4 is a block diagram flow chart illustrating an decoding algorithm for the codewords formed according to the encoding algorithm shown in FIG. 3.
Figure 5:
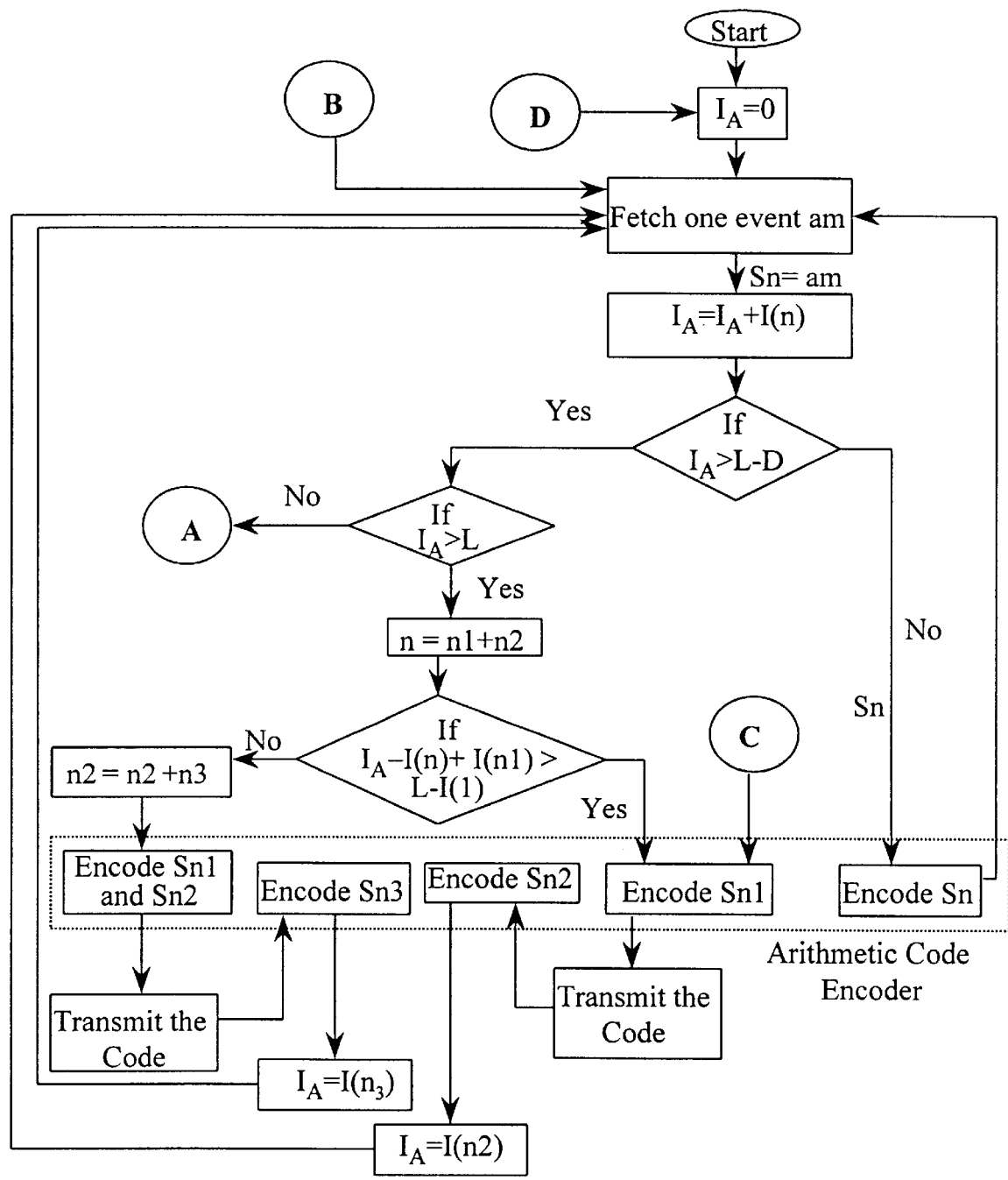
FIG. 5 and FIG. 6, when connected A—A, B—B, C—C and D—D, form a block diagram flow chart illustrating an encoding algorithm in accordance with another enbodiment of the present invention.
Figure 6:
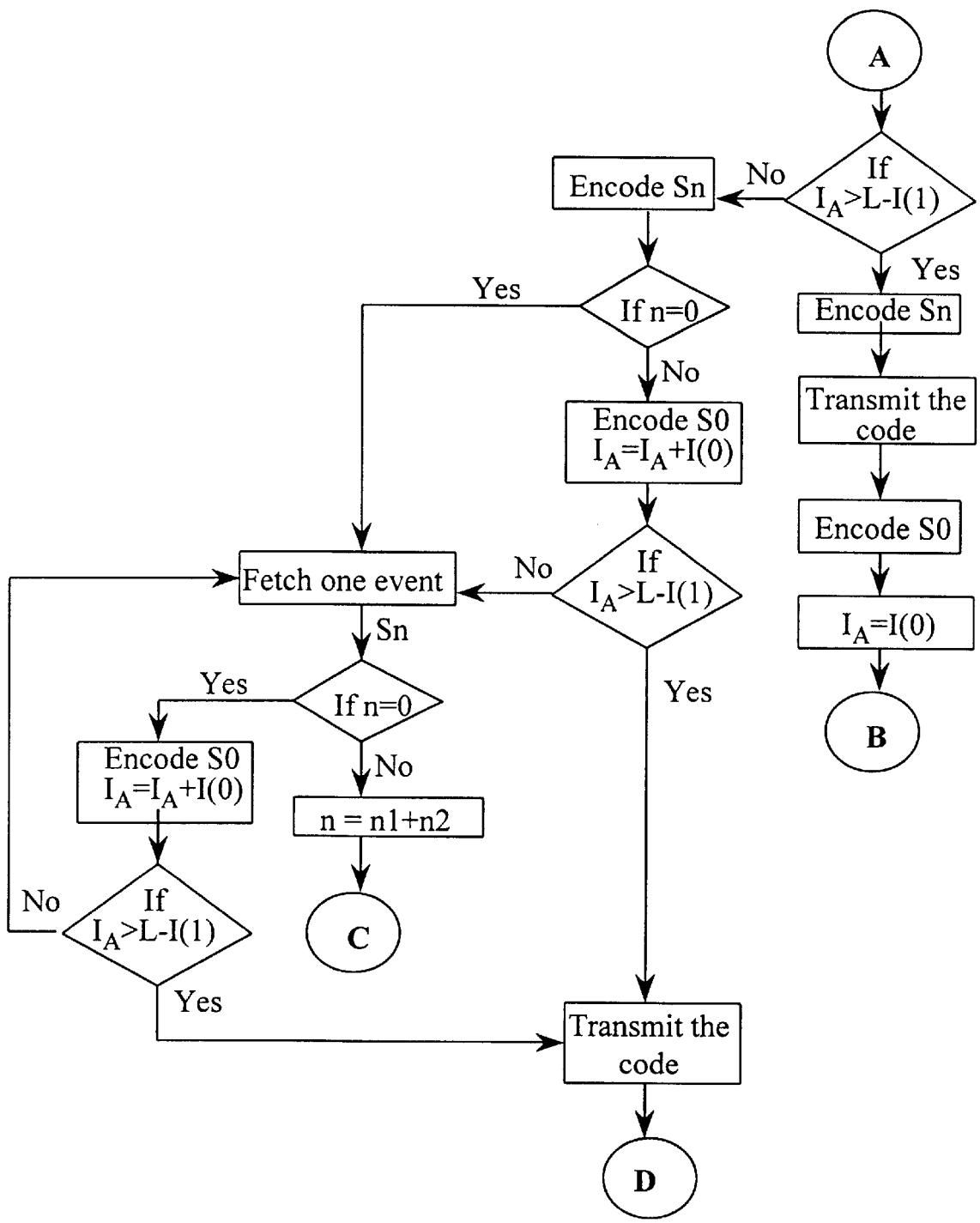
Figure 7:
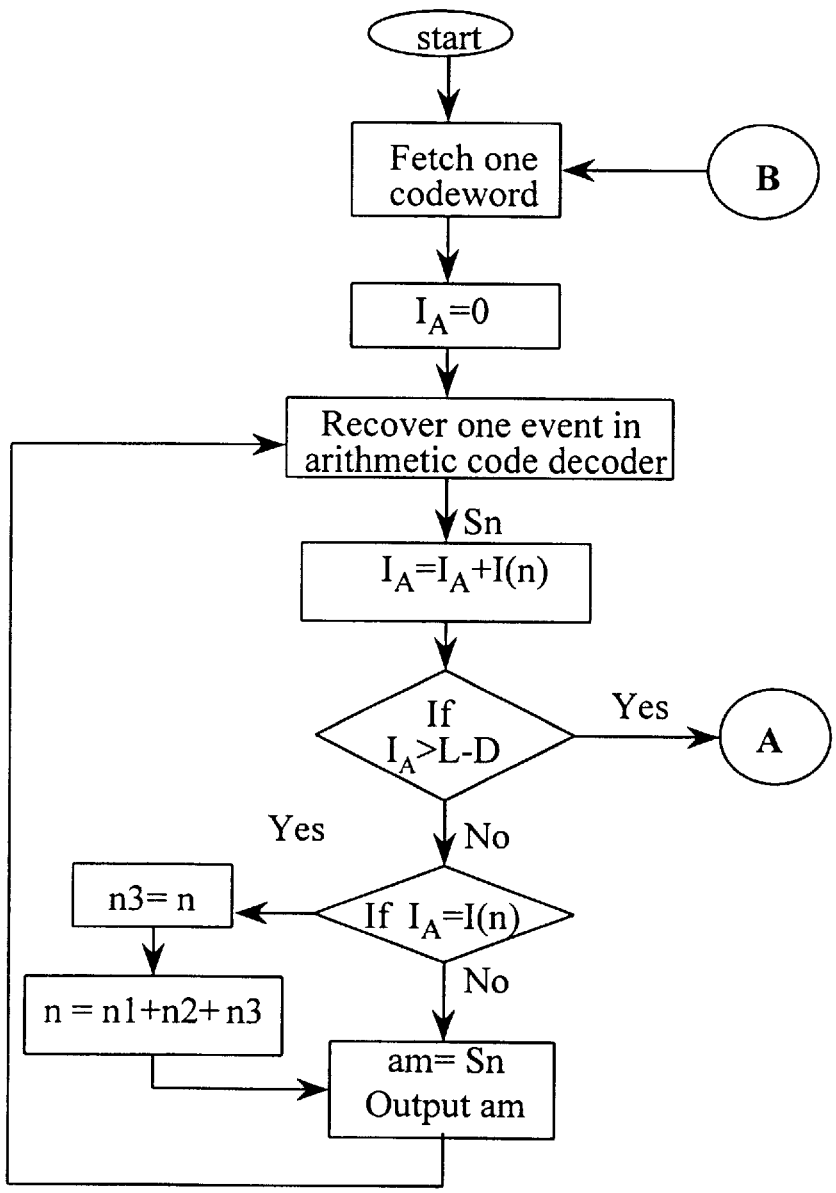
FIG. 7 and FIG. 8, when connected A—A and B—B, form a block diagram flow chart illustrating an decoding algorithm for the codewords formed according to the encoding algorithm shown in FIG. 5 and FIG. 6.
Figure 8:
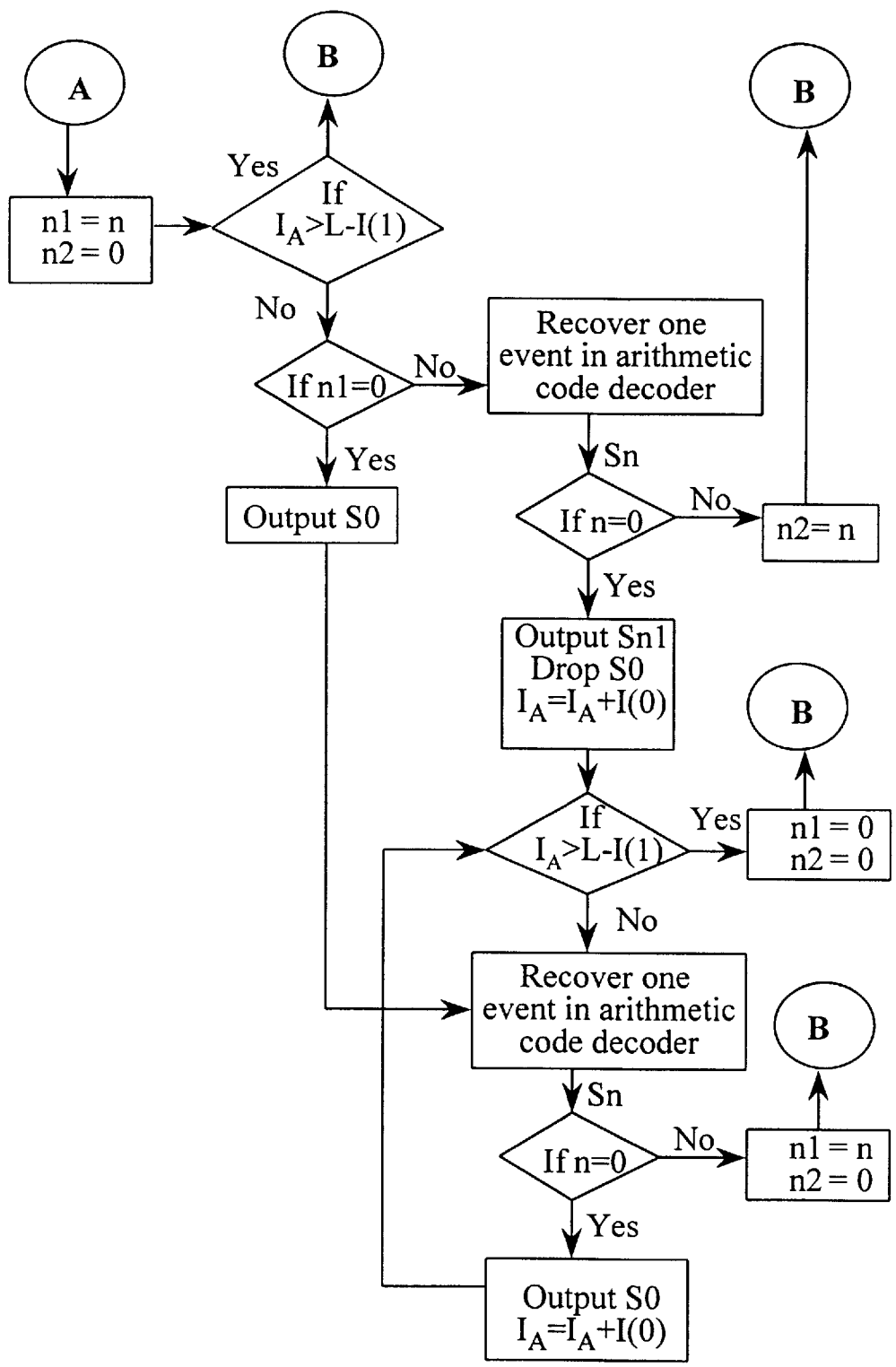

Using Level-1 connection indexing, the decoder, as the ordinary decoding procedure depicted in FIG. 2, directly decodes all normal symbol recursively. With an accumulated information of recovered events, we can also monitor the coding status as the encoder. When the accumulated information $I_A(K)$ is over L-D, we then stop decoding process. The index of the true last symbol will be obtained from the summation of the index of decoded last symbol and the index of first symbol in the next block. It is noted that the RT parameter, D plays as a guard role resulting in correct recovery of events without using any further information. If the finite-length coding uses the EOB symbol, the minimum number of wasted bits will be the maximum information bits, which corresponds to the least-probability symbol. Using connection indexing technique, the proposed algorithm with less average wasted bits is an efficient coding method. The flow graphs of proposed encoding and decoding are shown as FIG. 3 and FIG. 4, respectively.

B. Level-2 Connection Indexing

When the probability model of occurrence symbols are heavily unbalanced such that we may have large D, although it is much less than the maximum information bits corresponding to the least probability symbol. Hence, we further develop the Level-2 connection indexing technique to increase the efficiency. If the RT parameter for those probability models is large enough to satisfy $$D>I(1)+I(0), \quad (23)$$

we can further use the Level-2 connection indexing technique to elevate the efficiency for finite-length arithmetic codes. Similar to Level-1 connection indexing, we will continuously supervise the accumulated information until to the $K^{th}$ event which first satisfies $I_A(K)>L-D$. Then, the $K^{th}$ inputted event, $a_K$ will be encoded two or three connection indices as (15) or (16) shown. Thus, we will discuss the Level-2 connection indexing coding algorithm in the following two cases:

Case 1: $I_A(K)>L$

By using (19), we can search a largest $n_1$ to take the remaining information bits as many as possible. With the first sought index at hand, there are two possible cases we use the accumulated information including $I(n_1)$ to divide this case into two following subcases.

Subcase 1: $L-I(1)<I_A(K-1)+I(n_1)$

In this subcase, there is no enough information bits for further including another index. After the first connecting indexing, n, the further usage of the remaining bits in the current block becomes impossible. Thus, the encoding and decoding procedure to deal with the last symbol, $S_{n1}$ in the current block and the first symbol, $S_{n2}$ for the successive new block will be the same as the Level-1 connection indexing technique. Due to (23), $n_1$ must be larger than 0 that is different from the Level-1 connection indexing.

Subcase 2: $L-I(1)\geq I_A(K-1)+I(n_1)$

After the first connection index symbol $S_{n_1}$ is encoded, the accumulated information is $I_{A(K-1)}+I(n_1)$. The residual information bits, $L-I_A(K-1)-I(n_1)$, are still enough to convey one symbol, which their indices are larger than zero, since $$L-\{I_A(K-1)+I(n_1)\}\geq I(1) \quad (24)$$

Therefore, we can choose the second indexing symbol, $S_{n_2}$ such that $$n_2 = \underset{0 \leq j \leq N-1}{\text{MAX}} \quad \{I(j) \leq L - I_A(K-1) - I(n_1)\}. \quad (25)$$

Then, the arithmetic coding procedure will further encode symbol $S_{n_2}$ in the current block. Due to (23), both $n_1$ and $n_2$ are larger than 0. Then, the symbol with remaining index $$n_3 O(a_K)-n_1-n_2 \quad (26)$$

is first encoded as the first symbol of the next new block. Since $n_2$ is greater than zero, the propagated index $n_3$ using Level-2 connection indexing in (26) will less than that using Level-1 connection indexing, i.e., $n_2$ in (21). Thus, the coding efficiency of finite length arithmetic codes with Level-2 connection indexing will be better than that with Level-1 connection indexing.

Case 2: $I_A(K)\leq L$

In this case, it also can be divided into two subcases to be discussed in follows.

Subcase 1: $L-I(1)<I_A(K)$

In this subcase, there is no enough information bit for further including another index, which is greater than zero. The encoding and decoding procedures are identical to those in Case 2 of Level-1 connection indexing technique. We will encode $S_{n1}$ with $n_1=O(a_K)$ as the last symbol in the current block and use the connection symbol $S_0$ to be the first encoded symbol for the next block.

Subcase 2: $L-I(1)\geq I_A(K)$

If $a_K$ is $S_0$, we can continue encoding the successive inputted events until one inputted event is not symbol $S_0$ while the accumulated information is still kept below (L-I(1)). If this inputted event is the $M^{th}$ event $a_M$, we can switch this case to Subcase 1 of Case 1 by searching the symbol $S_{n'_1}$ which makes $$n'_1 = \underset{0 \leq j \leq N-1}{\text{MAX}} \quad \{I(j) \leq L - I_A(M-1)\}. \quad (27)$$

And the symbol with the remaining index $$n'_2=O(a_M)-n'_1 \quad (28)$$

will be first encoded in the next arithmetic code. If the successive events, i.e., $a_{K+1}, a_{K+2}, \ldots, a_{M-1}$, are a long series of symbol $S_0$, we can encode them until the $M^{th}$ event, $a_M$ which the accumulated information just pass $I_A(M)>(L-I(1))$. If $a_M$ is not $S_0$, we use (27) to search the symbol $S_{n_1}$ which is encoded in the current block. Then, the symbol with the remaining index shown as (28) is first encoded in the next arithmetic code. If $a_M$ is $S_0$, we can encode $a_M$ directly in the current block. For the next block, we can start from the next event, $a_{M+1}$ as the first symbol.

If the $K^{th}$ event, $a_K$ is not $S_0$, i.e., $O(a_K)\neq 0$, we encode the most probable symbol, $S_0$ behind the event $a_K$. After inserting $S_0$, the procedures are completely same as those in the previous paragraph.

For design the Level-2 connection indexing decoder, we can process the decoding procedure as Level-1 connection indexing before the accumulated information of the decoded events is first reach the condition $I_A(K)>L-D$.

If $O(a_K)=0(a_{K+1})=\ldots=O(a_{M-1})=0$, and $I_A(M)>L-I(1)$, we have two possible cases: 1) $O(a_M)=0$, we should terminate the decoding process for this block and we know the first event of the next new block will be the true symbol (i.e., not a connection symbol); 2) $O(a_M)>0$, this event is the first connection indexing symbol, of which index will be added to the first symbol index of the next block.

If $O(a_K)>0$, we then check whether $a_{K+1}$ is $S_0$ or not. If $a_{K+1}$ is not $S_0$, the connection (16) in Subcase 2 is performed. Hence, the connection index $n_1=O(a_K)$ and $n_2=O(a_{K+1})$ which will be added to the symbol index of the first decoded event in the next block. If $a_{K+1}$ is S0, we will drop out this decoded symbol first. The decoding procedure are looking for a nonzero-index decoded event, $a_M$, which $I_A(M-1)<L-I(1)$. Those decoded zero-index events will be the true events with $S_0$, i.e., $a_{K+1}=a_{K+2}=\ldots=a_{M-1}=S_0$. The index of the decoded $a_M$ is the first connection index, which will be added to that of the first decoded symbol in the next block. If the zero index events are continuously happened up to $I_A(M)>L-I(1)$. There are two cases which will be the same as those in the previous paragraph.

By (16), $n_1$ and $n_2$ are used as connection indices in Level-2 connect indexing technique, they should not be zeros due to the property of probability table shown as (23) Thus, we efficiently used $S_0$ to classify the cases between two Subcase 2 of Case 1 and Case 2. Since $S_0$ is most frequently-happened symbol, the consecutive $S_0$ symbols can be efficiently compacted. With Level-2 connection indexing technique and efficient coding of consecutive $S_0$ symbols, the above finite-length arithmetic codes achieve nearly optimal compacting. The flow graphs of proposed encoding and decoding are shown as FIG. 5 and FIG. 6, and FIG. 7 and FIG. 8, respectively.

Figure 9A:
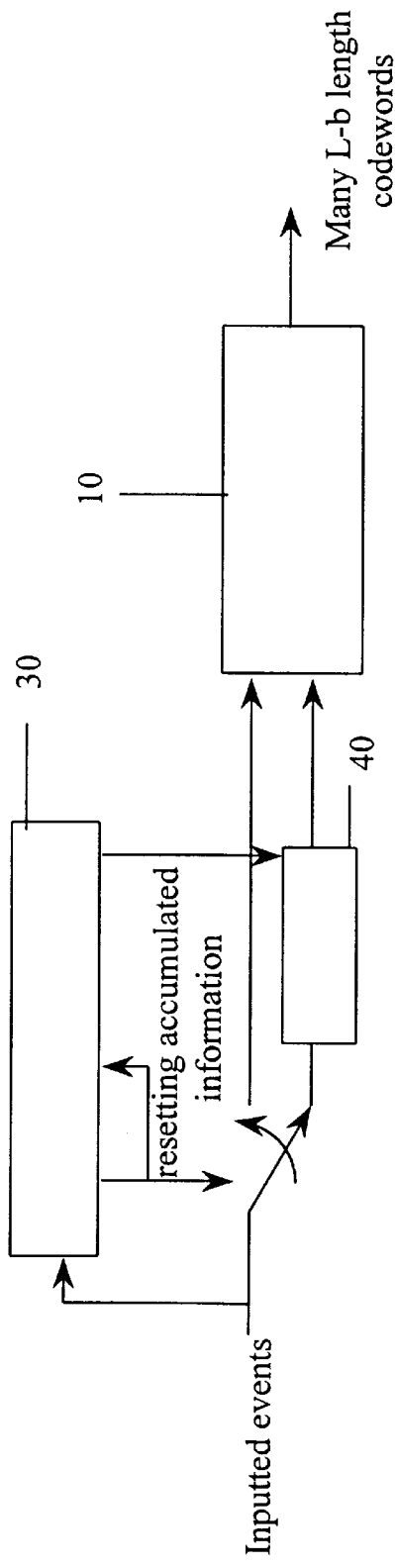
FIG. 9($a$) is a schematic block diagram illustrating an apparatus for encoding an input signal of the present invention.

FIG. 9(a) illustrates an apparatus for encoding an input signal having a plurality of symbols of the present invention. Said apparatus comprises:

means for recursively fetching in sequence an event from said input signal (not shown in the drawing);

arithmetic encoder 10 recursively supplied with a symbol of said input signal for generating codewords of a finite wordlength L containing arithmetically encoded symbols, said arithmetic encoder comprising means for supplying a probability estimate of said input signal and a symbol indexing means for supplying indices of said plurality of symbols of said input signal according to the number of information bits thereof;

information accumulating means 30 for adding information bits of a currently fetched event (a current event) to an accumulated information of events being fetched prior to said current event so that an updated accumulation information is obtained, for comparing said updated accumulation information with a splitting criteria of a difference between said finite wordlength L and the maximum information difference D of any two adjacent symbols in the order of their indices, and for determining said current event to be sent to a splitting means 40 when said updated accumulation information is not less than said splitting criteria or to said arithmetic encoder when said updated accumulation information is less than said splitting criteria;

said splitting means 40 for splitting a symbol of said current event into two split symbols having indices of $n_1$ and $n_2$ so that an index of said symbol of said current event is equal to a sum of $n_1$ and $n_2$, and the split symbol having an index of $n_1$ has the maximum information bits among said plurality of symbols of said input signal which satisfies that a sum of said accumulated information and information bits of the split symbol having an index of $n_1$ is greater than L−D and less than or equal to L, and for sending the split symbol having an index of $n_1$ and the split symbol having an index of $n_2$ in sequence to said arithmetic encoder, wherein a codeword having a finite wordlength L containing an arithmetically encoded symbol of said split symbol having an index of $n_1$ as the last encoded symbol is generated, and an arithmetically encoded symbol of said split symbol having an index of $n_2$ is assigned as a first encoded symbol of a codeword subsequent to said codeword having a finite wordlength L; and resetting means (not shown in the drawing) for setting said accumulated information equal to zero initially and for setting said accumulated information equal to the information bits of the split symbol having an index of $n_2$ when said codeword having a finite wordlength L is generated.

Figure 9B:
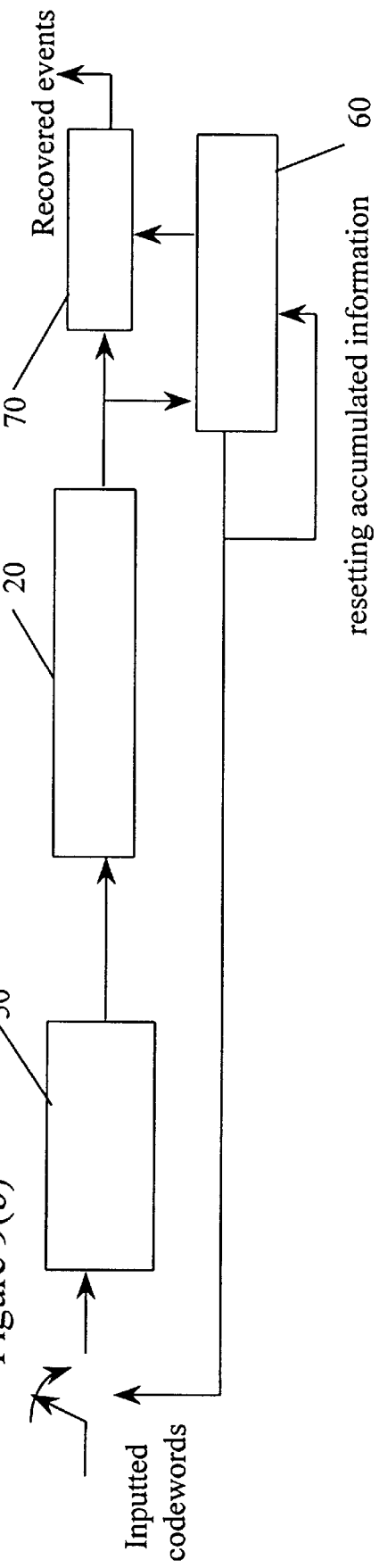

FIG. 9(b) illustrates an apparatus for decoding inputted codewords of a finite wordlength L containing arithmetically encoded symbols of the present invention. Said apparatus for decoding comprises:

means 50 for storing a codeword from said inputted codewords, a probability estimate of an input signal having a plurality of symbols from which said inputted codewords are generated, and indices of said plurality of symbols of said input signal according to the number of information bits thereof;

arithmetic decoder 20 recursively supplied with an arithmetically encoded symbol of said codeword in sequence from said storing means for generating a decoded symbol in response to said probability estimate;

information accumulating means 60 for adding information bits of a currently decoded symbol (a current symbol) to an accumulated information of said arithmetically encoded symbols being decoded prior to said current symbol so that an updated accumulation information is obtained, for comparing said updated accumulation information with a recovering criteria of a difference between said finite wordlength L and the maximum information difference D of any two adjacent symbols in the order of their indices, for determining said current symbol to be outputted as a recovered event when said updated accumulation information is less than said recovering criteria or to a recovering means 70 when said updated accumulation information is not less than said recovering criteria, and for causing said storing means to store a codeword subsequent to said codeword from said inputted codewords when said updated accumulation information is not less than said recovering criteria;

said recovering means 70 for adding an index of said current symbol to an index of a first decoded symbol of said subsequent codeword generated in said arithmetic decoder, and for outputting a symbol having an index of a sum of said addition as a recovered event; and resetting means (not shown in the drawing) for setting said accumulated information equal to zero when said codeword and said subsequent codeword are stored in sequence in said storing means.

VI. Simulation Results

To demonstrate the proposed arithmetic coding techniques, we use two symbol sets, which both contain ten symbols with their probability tables shown in Table 1 for our experiments. The 100*1000 events under the probability models stated in Table 1 are randomly generated and encoded by various variable length coders. For each 100 events, the number of encoded bits is recorded. After the average of 1000 results, Table 2 shows the average global accumulated information, the number of arithmetic code bits divided by 1000, the average numbers of encoded bits by proposed 32-bit and 64-bit arithmetic coding, and the optimal Huffman coding.

If we use arithmetic code, which is without prefix side information or post-added EOB symbol, the accumulated information in each simulation achieves $$I_G = \sum_{i=0}^{N-1} N_i \left( \log_2 \frac{1}{p(S_i)} \right), \tag{29}$$

where $N_i$ is the frequency count of symbol $S_i$ in 100 inputted events. The average of 1000 results of $I_G$ is equivalent to the average bit length of unlimited length arithmetic code, which is the bit length of the encoded 1000*100 events followed by the division of 1000. In other words, this average of $I_G$, which is the low bound of achieving the optimal arithmetic code, is an important limitation for any finite-length arithmetic coding method.

TABLE 1

Probability tables for two different symbol sets each with ten symbols

| Probability | Symbol Set 1 | Symbol Set 2 |
|---|---|---|
| p(0) | 25090/32768 | 28746/32768 |
| p(1) | 7496/32768 | 3924/32768 |
| p(2) | 163/32768 | 78/32768 |
| p(3) | 7/32768 | 8/32768 |
| p(4) | 2/32768 | 2/32768 |
| p(5) | 2/32768 | 2/32768 |
| p(6) | 2/32768 | 2/32768 |
| p(7) | 2/32768 | 2/32768 |
| p(8) | 2/32768 | 2/32768 |
| p(9) | 2/32768 | 2/32768 |

TABLE 2

The average number of encoded bits of 1000 independent runs by using variable length coding methods where 100 events in each run are generated by symbol probability tables depicted in Table 1. connection indexing).

| Variable Length Coding Method | Codeword Length | Symbol Set 1 | Symbol Set 2 |
|---|---|---|---|
| Huffman Coding | Not Applied | 124.213 bits | 112.771 bits |
| Optimal Arithmetic Coding $(I_G)$* | Not Applied | 82.336 bits | 56.110 bits |
| Finite-length Arithmetic Coding+ | 64 | 88.430 bits | 58.693 bits |
| Finite-length Arithmetic Coding+ | 32 | 95.526 bits | 63.640 bits |
| Finite-length Arithmetic Coding++ | 64 | 87.626 bits | 57.568 bits |
| Finite-length Arithmetic Coding++ | 32 | 93.824 bits | 60.216 bits |
| Entropy $\{H(s)*100\}$ | Not Applied | 82.754 bits | 56.120 bits |

*Using Eqs. (15) and 16:
+Layer-1 connection indexing;
++Layer-2 connection indexing.

From Table 2, we found that our proposed finite-length arithmetic coding methods in 32 and 64-bit length codewords nearly achieve the optimal performance of arithmetic coding, which uses the unlimited word length codeword. The coding efficient of Level-1 and Level-2 connection indexing techniques are close when the 64-bit-length codewords are used. When the length is decreased to 32-bit codewords, the Level-2 connection indexing method performs better than the Level-1.

Once an error (or errors) happens in a block, the destroy of most of complete block can be expected. Although there are connection indexing symbols between two consecutive blocks, the error propagation will just limited in the first symbols of the next block. Hence, we may say that the error propagation will be limited in about one block.

V. Conclusion

In this invention, we proposed finite-length arithmetic coding techniques, which result in efficient coding and regular realization in finite length machines. The proposed coding method without using any post EOB symbol or prefixed information effectively utilizes concepts of accumulated information and connection indexing to achieve a better finite length arithmetic coding scheme. Both theoretical inference and simulation results shows that the reasonable 32-bit wordlength codes can practically achieve low encoded bits, which are close to the optimal entropy coding. Related to recently-developed computational processors, our proposed finite-length arithmetic coding will become a better choose for various applications.

REFERENCES

[1]. Mark Nelson, *The Data Compression Book*, Published by M&T publishing Inc.,USA, 1991.

[2]. C. E. Shannon, "A mathematical theory of communication," *Bell Syst. Tech. J*, Vol.27, pp.398–403, Jul., 1948.

[3]. P. Elias, in N. Abramson, *Information Theory and Coding*, McGraw-Hill Book Co., Inc., New York, 1963.

[4]. G. G. Langdon and J. J. Rissanen, "Arithmetic coding," *IBM J Res Develop.* Vol.23, No.2, pp. 149–162, Mar. 1979.

[5]. I. H. Witten, R. M. Neal, and J. G. Cleary, "Arithmetic coding for data compression," Computing Practices, *Communication of the ACM*, Vol.30, No.6, pp.520–540, Jun., 1987.

[6]. T. C. Bell, J. G. Cleary and I. H. Witten, *Text Compression*, Englewood Cliffs, N.J.: Prentice-Hall, 1990.

[7]. G. G. Langdon and J. J. Rissanen, "A simple general binary source code," *IEEE Trans. Info. Theory*, IT-28, pp.800–803, 1982.

[8]. G. G. Langdon and J. J. Rissanen, "Compression of black-white image with arithmetic coding," *IEEE Trans. Commun.*, COM-29, pp.858–867, 1982.

[9] R. Arps, T. K. Truong, D. J. Lu, R. C. Pasco, and T. D. Friedman, "A multi-purpose VLSI chip for adaptive data compression of bilevel images," *IBM J. Res Develop.* Vol.32, No.6, p.775,Nov. 1988.

[10]. W. B. Pennebaker, J. L. Mitchell, G. G. Langdon, Jr. and R. B. Arps, "An overview of the basic principles of the Q-coder adaptive binary arithmetic coder," *IBM J Res Develop.* Vol.32, No.6, pp.717–726, Nov. 1988.

[11]. J. L. Mitchell and W. B. Pennebaker, "Optimal hardware and software arithmetic coding procedures for the Q-coder," *IBM J Res Develop.* Vol.32, No.6, pp.727–736, Nov. 1988.

[12]. P. G. Howard and J. S. Vitter, "Arithmetic coding for data compression," *Proc. of IEEE*, Vol.82, No.6, pp.857–865, Jun., 1994.

[13]. C. G. Boncelet and Jr., "Extensions to block arithmetic coding," in *Proc. 1992 Conf Inform. Sci. and Syst.*, pp.691–695, Mar. 1992, Princeton N.J.

[14]. C. G. Boncelet and Jr., "Experiments in block arithmetic coding," Univ. Delaware, Dep. Elec. Eng., Tech. Rep. 93-2-1, 1993.

[15]. C. G. Boncelet and Jr., "Block arithmetic coding for source compression," *IEEE Trans. Info. Theory*, Vol..39, No.5, pp1546–1554, Sep., 1993.

[16]. J. Teuhola and T. Roita, "Arithmetic coding into fixed-length codewords," *IEEE Trans. Info. Theory*, Vol..40, No.1, pp.219–223, Jan., 1994.

[17]. S. D. Stearns, "Arithmetic coding in lossless waveform compression," *IEEE Trans. on Signal Processing*, Vol. 43, No.8, pp.1847–1879, Aug. 1995.

[18]. J. Teuhola and T. Raita, "Piecewise arithmetic coding," *Proc. of Data Compression Conf.* 1991, pp.33–42, J. A. Storer and J. H. Reif, Eds., Snow Bird, Utah, Apr., 1991.

We claim:

1. A method for transmitting an input signal having a plurality of symbols comprising the following steps:
   a) encoding said input signal received from a source to obtain a finite length codeword of said input signal by finite-length arithmetic coding; and
   b) outputting said finite length codeword;
   wherein said encoding comprising the following steps:
   a1) selecting a predetermined finite wordlength L;
   a2) supplying a probability estimate of said input signal;
   a3) obtaining information bits for each symbol of said input signal according to said probability estimate;
   a4) indexing said symbols according to their information bits in descending probabilities from 0, 1, 2 . . . to N–1;
   a5) calculating the maximum difference of the information bits of any two adjacent symbols in the order of their indices as a residual termination parameter D;

a6) setting an accumulated information equal to zero;

a7) fetching in sequence one event $O(a_k)$ from said input signal;

a8) updating said accumulated information by adding information bits of said fetched event to said accumulated information;

a9) arithmetically encoding said fetched event in response to said probability estimate if the updated accumulated information is less than L−D;

a10) repeating steps a7) to a9) until the updated accumulated information is equal to or greater than L−D;

a11) recording an index n of a symbol of an event which is the last event being fetched in step a10);

a12) selecting a symbol from said plurality of symbols of said input signal so that a condition of a sum of said accumulated information and information bits of said selected symbol greater than L−D and less than or equal to L is satisfied, and said selected symbol having an index of $n_1$ ($S_{n1}$) is the maximum among the indices of the symbols which satisfy said condition;

a13) arithmetically encoding said symbol $S_{n1}$ in response to said probability estimate so that a finite length codeword containing the arithmetically encoded events obtained in steps a9) and a10) and the arithmetically encoded symbol of said symbol $S_{n1}$ is formed;

a14) finding a symbol from said plurality symbols of said input signal having an index of n2 so that n1+n2=n;

a15) arithmetically encoding said symbol $S_{n2}$ in response to said probability estimate as a first encoded symbol of a codeword next said finite length codeword;

a16) setting an accumulated information equal to the information bit of the symbol $S_{n2}$; and a17) repeating steps a7) to a16) until all of the events of said input signal are arithmetically encoded;

wherein D is equal to or greater than the information bits of the symbol of said input signal having the largest probability.

2. A method for decoding finite length codewords generated according to the method of claim 1 comprising the following steps:

a) inputting said finite length codewords, each of which has a predetermined finite wordlength L and contains a plurality of arithmetically encoded symbols; and b) arithmetically decoding said arithmetically encoded symbols to generate a plurality of decoded symbols; and recovering a sequence of events from said decoded symbols wherein said step b) comprising the following steps:

b1) fetching a first finite length codeword from said inputted finite length codewords;

b2) setting an accumulated information equal to zero;

b3) arithmetically decoding in sequence an arithmetically encoded symbol from said first finite length codeword in response to said probability estimate to generate a decoded symbol;

b4) updating said accumulated information by adding information bits of said decoded symbol to said accumulated information;

b5) outputting said decoded symbol as a recovered event if the updated accumulated information is less than L−D, wherein D is the residual termination parameter;

b6) repeating steps b3) to b5) until the updated accumulated information is equal to or greater than L−D;

b7) recording an index n1 of the decoded symbol which is the last symbol being arithmetically decoded in step b6);

b8) fetching in sequence a $m^{th}$ finite length codeword from said inputted finite length codewords, wherein said m is an integer of not less than 2;

b9) setting an accumulated information equal to zero;

b10) arithmetically decoding in sequence an arithmetically encoded symbol of said $m^{th}$ finite length codeword in response to said probability estimate to generate a decoded symbol;

b11) updating said accumulated information by adding information bits of said decoded symbol to said accumulated information;

b12) if the updated accumulated information is equal to the information bits of said decoded symbol, recording an index n2 of the decoded symbol and outputting a decoded symbol as a recovered symbol having an index n which is equal to a sum of n1 and n2;

b13) repeating steps b10) to b11) and outputting said decoded symbol as a recovered event until the updated accumulated information is equal to or greater than L−D;

b14) recording an index n1 of the decoded symbol which is the last symbol being arithmetically decoded in step b13);

b15) repeating steps b8) to b14) until all of said inputted finite length codewords are fetched and arithmetically decoded.

3. An apparatus for encoding an input signal having a plurality of symbols comprising:

means for recursively fetching in sequence an event from said input signal;

arithmetic encoder recursively supplied with a symbol of said input signal for generating codewords of a finite wordlength L containing arithmetically encoded symbols, said arithmetic encoder comprising means for supplying a probability estimate of said input signal and a symbol indexing means for supplying indices of said plurality of symbols of said input signal according to the number of information bits thereof;

information accumulating means for adding information bits of a currently fetched event (a current event) to an accumulated information of events being fetched prior to said current event so that an updated accumulation information is obtained, for comparing said updated accumulation information with a splitting criteria of a difference between said finite wordlength L and the maximum information difference D of any two adjacent symbols in the order of their indices, and for determining said current event to be sent to a splitting means when said updated accumulation information is not less than said splitting criteria or to said arithmetic encoder when said updated accumulation information is less than said splitting criteria;

said splitting means for splitting a symbol of said current event into two split symbols having indices of n1 and n2 so that an index of said symbol of said current event is equal to a sum of n1 and n2, and the split symbol having an index of n1 has the maximum information bits among said plurality of symbols of said input signal which satisfies that a sum of said accumulated information and information bits of the split symbol having an index of n1 is greater than L−D and less than or equal to L, and for sending the split symbol having an index of n1 and the split symbol having an index of n2 in sequence to said arithmetic encoder, wherein a codeword having a finite wordlength L containing an arithmetically encoded symbol of said split symbol having an index of n1 as the last encoded symbol is generated, and an arithmetically encoded symbol of said split symbol having an index of n2 is assigned as a first encoded symbol of a codeword subsequent to said codeword having a finite wordlength L; and resetting means for setting said accumulated information equal to zero initially and for setting said accumulated information equal to the information bits of the split symbol having an index of n2 when said codeword having a finite wordlength L is generated.

4. An apparatus for decoding inputted codewords of a finite wordlength L containing arithmetically encoded symbols comprising:

means for storing a codeword from said inputted codewords, a probability estimate of an input signal having a plurality of symbols from which said inputted codewords are generated, and indices of said plurality of symbols of said input signal according to the number of information bits thereof;

arithmetic decoder recursively supplied with an arithmetically encoded symbol of said codeword in sequence from said storing means for generating a decoded symbol in response to said probability estimate;

information accumulating means for adding information bits of a currently decoded symbol (a current symbol) to an accumulated information of said arithmetically encoded symbols being decoded prior to said current symbol so that an updated accumulation information is obtained, for comparing said updated accumulation information with a recovering criteria of a difference between said finite wordlength L and the maximum information difference D of any two adjacent symbols in the order of their indices, for determining said current symbol to be outputted as a recovered event when said updated accumulation information is less than said recovering criteria or to a recovering means when said updated accumulation information is not less than said recovering criteria, and for causing said storing means to store a codeword subsequent to said codeword from said inputted codewords when said updated accumulation information is not less than said recovering criteria;

said recovering means for adding an index of said current symbol to an index of a first decoded symbol of said subsequent codeword generated in said arithmetic decoder, and for outputting a symbol having an index of a sum of said addition as a recovered event; and resetting means for setting said accumulated information equal to zero when said codeword and said subsequent codeword are stored in sequence in said storing means.

* * * * *

UNITED STATES PATENT AND TRADEMARK OFFICE
CERTIFICATE OF CORRECTION

PATENT NO. : 5,808,572
DATED : September 15, 1998
INVENTOR(S) : Yang, et al.

It is certified that error appears in the above-identified patent and that said Letters Patent is hereby corrected as shown below:

Col.2, line 30, "$I(S_o) \geq I(S_1 \geq \ldots \leq I(S_{n-1}))$," should be $--I(S_o) \geq I(S_1 \geq \ldots \geq I(S_0) \leq I(S_1) \leq \ldots \leq I(S_{N-1})$, --;

Col. 2, line 55, "$B_L = B_L + B_L (B_U - B_L) x P_c(O(a_m))$" should be $--B_L = B_L + (B_U - B_L) x P_c(O(a_m))--$;

Col. 7, line 41, "$D = Max\{I(n)-I(n-1)\} n \bullet 0, 1, \ldots, N-1\{$," should be $-- D = Max\{ I(n)-I(n-1) \} n = 0, 1, \ldots, N-1\}$, Col. 9, line 26, "n" should be $--n_1--$;

Col. 9, line 35, "$I_{A(K}-1)+I(n_1)$" should be $--I_A(K-1)+I(n_1)--$;

Col. 9, line 50, "$n_3 0(a_K)-n_1-n_2$" should be $--n_3 = 0(a_K)-n_1-n_2--$;

Col. 10, line 21, "$S._1$" should be $--S_{n'_1}--$;

Col. 10, line 46, "S0" should be $--S_0--$;

Signed and Sealed this

Twenty-second Day of December, 1998

Attest:

BRUCE LEHMAN

Attesting Officer

Commissioner of Patents and Trademarks